(12) United States Patent
Herner

(10) Patent No.: US 8,791,010 B1
(45) Date of Patent: Jul. 29, 2014

(54) SILVER INTERCONNECTS FOR STACKED NON-VOLATILE MEMORY DEVICE AND METHOD

(75) Inventor: Scott Brad Herner, San Jose, CA (US)

(73) Assignee: Crossbar, Inc., Santa Clara, CA (US)

( * ) Notice: Subject to any disclaimer, the term of this patent is extended or adjusted under 35 U.S.C. 154(b) by 203 days.

(21) Appl. No.: 13/339,851

(22) Filed: Dec. 29, 2011

Related U.S. Application Data

(60) Provisional application No. 61/428,982, filed on Dec. 31, 2010.

(51) Int. Cl.
*H01L 47/00* (2006.01)

(52) U.S. Cl.
USPC .................. 438/618; 438/686; 438/900

(58) Field of Classification Search
CPC ........................................... H01L 45/04
USPC ................. 257/2, 4, 5; 438/618, 686, 900
See application file for complete search history.

(56) References Cited

U.S. PATENT DOCUMENTS

| | | | |
|---|---|---|---|
| 680,652 A | 8/1901 | Elden | |
| 4,433,468 A | 2/1984 | Kawamata | |
| 4,684,972 A | 8/1987 | Owen et al. | |
| 4,741,601 A | 5/1988 | Saito | |
| 5,139,911 A | 8/1992 | Yagi et al. | |
| 5,242,855 A | 9/1993 | Oguro | |
| 5,278,085 A | 1/1994 | Maddox, III et al. | |
| 5,315,131 A | 5/1994 | Kishimoto et al. | |
| 5,335,219 A | 8/1994 | Ovshinsky et al. | |
| 5,360,981 A | 11/1994 | Owen et al. | |
| 5,457,649 A | 10/1995 | Eichman et al. | |
| 5,538,564 A | 7/1996 | Kaschmitter | |
| 5,541,869 A | 7/1996 | Rose et al. | |
| 5,594,363 A | 1/1997 | Freeman et al. | |
| 5,614,756 A | 3/1997 | Forouhi et al. | |
| 5,707,487 A | 1/1998 | Hori et al. | |
| 5,714,416 A | 2/1998 | Eichman et al. | |
| 5,751,012 A | 5/1998 | Wolstenholme et al. | |
| 5,840,608 A | 11/1998 | Chang | |

(Continued)

FOREIGN PATENT DOCUMENTS

| | | |
|---|---|---|
| EP | 2405441 A1 | 1/2012 |
| EP | 2408035 A2 | 1/2012 |

(Continued)

OTHER PUBLICATIONS

Office Action for U.S. Appl. No. 12/814,410 dated Apr. 17, 2012.

(Continued)

*Primary Examiner* — Matthew Reames
(74) *Attorney, Agent, or Firm* — Ogawa P.C.

(57) ABSTRACT

A method of forming a memory device. A first thickness of dielectric material overlies a surface region of a substrate. A first wiring material including a first lining material and a silver material are formed overlying the dielectric material. A first adhesion material and an amorphous silicon switching material including a contact material are deposited overlying the first wiring material. The method forms one or more first structures configured to spatially extend in a first direction from the amorphous silicon switching material, the contact material, and the first wiring material. A thickness of second dielectric material is deposited overlying the one or more first structures. The method forms a second wiring structure comprising at least a second silver material and a second lining material spatially extending in a second direction orthogonal to the first direction overlying the second dielectric material and in electrical contact with the switching material.

21 Claims, 8 Drawing Sheets

(56) References Cited

U.S. PATENT DOCUMENTS

| | | |
|---|---|---|
| 5,970,332 A | 10/1999 | Pruijmboom et al. |
| 5,998,244 A | 12/1999 | Wolstenholme et al. |
| 6,128,214 A | 10/2000 | Kuekes et al. |
| 6,143,642 A | 11/2000 | Sur, Jr. et al. |
| 6,259,116 B1 | 7/2001 | Shannon |
| 6,291,836 B1 | 9/2001 | Kramer et al. |
| 6,436,765 B1 | 8/2002 | Liou et al. |
| 6,436,818 B1 | 8/2002 | Hu et al. |
| 6,492,694 B2 | 12/2002 | Noble et al. |
| 6,627,530 B2 | 9/2003 | Li et al. |
| 6,762,474 B1 | 7/2004 | Mills, Jr. |
| 6,768,157 B2 | 7/2004 | Krieger et al. |
| 6,815,286 B2 | 11/2004 | Krieger et al. |
| 6,838,720 B2 | 1/2005 | Krieger et al. |
| 6,858,481 B2 | 2/2005 | Krieger et al. |
| 6,858,482 B2 | 2/2005 | Gilton |
| 6,864,127 B2 | 3/2005 | Yamazaki et al. |
| 6,864,522 B2 | 3/2005 | Krieger et al. |
| 6,881,994 B2 | 4/2005 | Lee et al. |
| 6,939,787 B2 | 9/2005 | Ohtake et al. |
| 6,946,719 B2 | 9/2005 | Petti et al. |
| 7,020,006 B2 | 3/2006 | Chevallier et al. |
| 7,023,093 B2 | 4/2006 | Canaperi et al. |
| 7,026,702 B2 | 4/2006 | Krieger et al. |
| 7,102,150 B2 | 9/2006 | Harshfield et al. |
| 7,122,853 B1 | 10/2006 | Gaun et al. |
| 7,187,577 B1 | 3/2007 | Wang et al. |
| 7,221,599 B1 | 5/2007 | Gaun et al. |
| 7,238,607 B2 | 7/2007 | Dunton et al. |
| 7,254,053 B2 | 8/2007 | Krieger et al. |
| 7,289,353 B2 | 10/2007 | Spitzer et al. |
| 7,324,363 B2 | 1/2008 | Kerns et al. |
| 7,365,411 B2 | 4/2008 | Campbell |
| 7,405,418 B2 | 7/2008 | Happ et al. |
| 7,426,128 B2 | 9/2008 | Scheuerlein |
| 7,433,253 B2 | 10/2008 | Gogl et al. |
| 7,474,000 B2 | 1/2009 | Scheuerlein et al. |
| 7,479,650 B2 | 1/2009 | Gilton |
| 7,521,705 B2 | 4/2009 | Liu |
| 7,534,625 B2 | 5/2009 | Karpov et al. |
| 7,541,252 B2 | 6/2009 | Eun et al. |
| 7,550,380 B2 | 6/2009 | Elkins et al. |
| 7,606,059 B2 | 10/2009 | Toda |
| 7,615,439 B1 | 11/2009 | Schricker et al. |
| 7,629,198 B2 | 12/2009 | Kumar et al. |
| 7,728,318 B2 | 6/2010 | Raghuram et al. |
| 7,729,158 B2 | 6/2010 | Toda et al. |
| 7,749,805 B2 | 7/2010 | Pinnow et al. |
| 7,772,581 B2 | 8/2010 | Lung |
| 7,778,063 B2 | 8/2010 | Brubaker et al. |
| 7,786,464 B2 | 8/2010 | Nirschl et al. |
| 7,786,589 B2 | 8/2010 | Matsunaga et al. |
| 7,824,956 B2 | 11/2010 | Schricker et al. |
| 7,829,875 B2 | 11/2010 | Scheuerlein |
| 7,835,170 B2 | 11/2010 | Bertin et al. |
| 7,858,468 B2 | 12/2010 | Liu et al. |
| 7,859,884 B2 | 12/2010 | Scheuerlein |
| 7,875,871 B2 | 1/2011 | Kumar et al. |
| 7,881,097 B2 | 2/2011 | Hosomi et al. |
| 7,897,953 B2 | 3/2011 | Liu |
| 7,898,838 B2 | 3/2011 | Chen et al. |
| 7,920,412 B2 | 4/2011 | Hosotani et al. |
| 7,924,138 B2 | 4/2011 | Kinoshita et al. |
| 7,968,419 B2 | 6/2011 | Li et al. |
| 7,972,897 B2 | 7/2011 | Kumar et al. |
| 7,984,776 B2 | 7/2011 | Beyer et al. |
| 8,004,882 B2 | 8/2011 | Katti et al. |
| 8,018,760 B2 | 9/2011 | Muraoka et al. |
| 8,021,897 B2 | 9/2011 | Sills et al. |
| 8,045,364 B2 | 10/2011 | Schloss et al. |
| 8,054,674 B2 | 11/2011 | Tamai et al. |
| 8,067,815 B2 | 11/2011 | Chien et al. |
| 8,071,972 B2 | 12/2011 | Lu et al. |
| 8,088,688 B1 | 1/2012 | Herner |
| 8,097,874 B2 | 1/2012 | Venkatasamy et al. |
| 8,102,698 B2 | 1/2012 | Scheuerlein |
| 8,143,092 B2 | 3/2012 | Kumar et al. |
| 8,144,498 B2 | 3/2012 | Kumar et al. |
| 8,164,948 B2 | 4/2012 | Katti et al. |
| 8,168,506 B2 | 5/2012 | Herner |
| 8,183,553 B2 | 5/2012 | Phatak et al. |
| 8,187,945 B2 | 5/2012 | Herner |
| 8,198,144 B2 | 6/2012 | Herner |
| 8,207,064 B2 | 6/2012 | Bandyopadhyay et al. |
| 8,227,787 B2 | 7/2012 | Kumer et al. |
| 8,231,998 B2 | 7/2012 | Albano et al. |
| 8,233,308 B2 | 7/2012 | Schricker et al. |
| 8,237,146 B2 | 8/2012 | Kreupl et al. |
| 8,258,020 B2 | 9/2012 | Herner |
| 8,274,812 B2 | 9/2012 | Nazarian et al. |
| 8,315,079 B2 | 11/2012 | Kuo et al. |
| 8,320,160 B2 | 11/2012 | Nazarian |
| 8,374,018 B2 | 2/2013 | Lu |
| 8,385,100 B2 | 2/2013 | Kau et al. |
| 8,389,971 B2 | 3/2013 | Chen et al. |
| 8,394,670 B2 | 3/2013 | Herner |
| 8,399,307 B2 | 3/2013 | Herner |
| 8,467,227 B1 | 6/2013 | Jo |
| 8,658,476 B1 | 2/2014 | Sun et al. |
| 8,659,003 B2 | 2/2014 | Herner et al. |
| 2003/0052330 A1 | 3/2003 | Klein |
| 2004/0026682 A1 | 2/2004 | Jiang |
| 2004/0170040 A1 | 9/2004 | Rinerson et al. |
| 2004/0192006 A1 | 9/2004 | Campbell et al. |
| 2004/0194340 A1 | 10/2004 | Kobayashi |
| 2005/0020510 A1 | 1/2005 | Benedict |
| 2005/0029587 A1 | 2/2005 | Harshfield |
| 2005/0052915 A1 | 3/2005 | Herner et al. |
| 2005/0062045 A1 | 3/2005 | Bhattacharyya |
| 2005/0073881 A1 | 4/2005 | Tran et al. |
| 2006/0017488 A1 | 1/2006 | Hsu |
| 2006/0281244 A1 | 12/2006 | Ichige et al. |
| 2007/0008773 A1 | 1/2007 | Scheuerlein |
| 2007/0015348 A1 | 1/2007 | Hsu et al. |
| 2007/0045615 A1 | 3/2007 | Cho et al. |
| 2007/0087508 A1 | 4/2007 | Herner |
| 2007/0090425 A1 | 4/2007 | Kumar et al. |
| 2007/0105284 A1 | 5/2007 | Herner |
| 2007/0105390 A1 | 5/2007 | Oh |
| 2007/0205510 A1 | 9/2007 | Lavoie et al. |
| 2007/0228414 A1 | 10/2007 | Kumar et al. |
| 2007/0284575 A1 | 12/2007 | Li et al. |
| 2007/0290186 A1 | 12/2007 | Bourim et al. |
| 2007/0291527 A1 | 12/2007 | Tsushima et al. |
| 2007/0295950 A1 | 12/2007 | Cho et al. |
| 2008/0002481 A1 | 1/2008 | Gogl et al. |
| 2008/0006907 A1 | 1/2008 | Lee et al. |
| 2008/0048164 A1 | 2/2008 | Odagawa |
| 2008/0089110 A1 | 4/2008 | Robinett et al. |
| 2008/0090337 A1 | 4/2008 | Williams |
| 2008/0106925 A1 | 5/2008 | Paz De Araujo et al. |
| 2008/0106926 A1 | 5/2008 | Brubaker et al. |
| 2008/0185567 A1 | 8/2008 | Kumar et al. |
| 2008/0205179 A1 | 8/2008 | Markert et al. |
| 2008/0206931 A1 | 8/2008 | Breuil et al. |
| 2008/0220601 A1 | 9/2008 | Kumar et al. |
| 2008/0232160 A1 | 9/2008 | Gopalakrishnan |
| 2008/0278990 A1 | 11/2008 | Kumar et al. |
| 2008/0304312 A1 | 12/2008 | Ho et al. |
| 2008/0311722 A1 | 12/2008 | Petti et al. |
| 2009/0001345 A1 | 1/2009 | Schricker et al. |
| 2009/0014707 A1 | 1/2009 | Lu et al. |
| 2009/0052226 A1 | 2/2009 | Lee et al. |
| 2009/0095951 A1 | 4/2009 | Kostylev et al. |
| 2009/0152737 A1 | 6/2009 | Harshfield |
| 2009/0168486 A1 | 7/2009 | Kumar |
| 2009/0231910 A1 | 9/2009 | Liu et al. |
| 2009/0256130 A1 | 10/2009 | Schricker |
| 2009/0257265 A1 | 10/2009 | Chen et al. |
| 2009/0267047 A1 | 10/2009 | Sasago et al. |
| 2009/0298224 A1 | 12/2009 | Lowrey |
| 2009/0321789 A1 | 12/2009 | Wang et al. |
| 2010/0007937 A1 | 1/2010 | Widjaja et al. |
| 2010/0012914 A1 | 1/2010 | Xu et al. |

(56) References Cited

U.S. PATENT DOCUMENTS

| | | |
|---|---|---|
| 2010/0019221 A1 | 1/2010 | Lung et al. |
| 2010/0019310 A1 | 1/2010 | Sakamoto |
| 2010/0032638 A1 | 2/2010 | Xu |
| 2010/0032640 A1 | 2/2010 | Xu |
| 2010/0044708 A1 | 2/2010 | Lin et al. |
| 2010/0084625 A1 | 4/2010 | Wicker et al. |
| 2010/0085798 A1 | 4/2010 | Lu et al. |
| 2010/0090192 A1 | 4/2010 | Goux et al. |
| 2010/0101290 A1 | 4/2010 | Bertolotto |
| 2010/0102290 A1 | 4/2010 | Lu et al. |
| 2010/0157651 A1 | 6/2010 | Kumar et al. |
| 2010/0157710 A1 | 6/2010 | Lambertson et al. |
| 2010/0163828 A1 | 7/2010 | Tu |
| 2010/0176368 A1 | 7/2010 | Ko et al. |
| 2010/0219510 A1 | 9/2010 | Scheuerlein et al. |
| 2010/0221868 A1 | 9/2010 | Sandoval |
| 2010/0321095 A1 | 12/2010 | Mikawa et al. |
| 2011/0006275 A1 | 1/2011 | Roelofs et al. |
| 2011/0089391 A1 | 4/2011 | Mihnea et al. |
| 2011/0133149 A1 | 6/2011 | Sonehara |
| 2011/0136327 A1 | 6/2011 | Han et al. |
| 2011/0155991 A1 | 6/2011 | Chen |
| 2011/0194329 A1 | 8/2011 | Ohba et al. |
| 2011/0198557 A1 | 8/2011 | Rajendran et al. |
| 2011/0204312 A1 | 8/2011 | Phatak |
| 2011/0205782 A1 | 8/2011 | Costa et al. |
| 2011/0227028 A1 | 9/2011 | Sekar et al. |
| 2011/0284814 A1 | 11/2011 | Zhang |
| 2011/0305064 A1 | 12/2011 | Jo et al. |
| 2011/0312151 A1 | 12/2011 | Herner |
| 2011/0317470 A1 | 12/2011 | Lu et al. |
| 2012/0001145 A1 | 1/2012 | Magistretti et al. |
| 2012/0007035 A1 | 1/2012 | Jo et al. |
| 2012/0008366 A1 | 1/2012 | Lu |
| 2012/0012806 A1 | 1/2012 | Herner |
| 2012/0012808 A1 | 1/2012 | Herner |
| 2012/0015506 A1 | 1/2012 | Jo et al. |
| 2012/0025161 A1 | 2/2012 | Rathor et al. |
| 2012/0033479 A1 | 2/2012 | Delucca et al. |
| 2012/0043519 A1 | 2/2012 | Jo et al. |
| 2012/0043621 A1 | 2/2012 | Herner |
| 2012/0043654 A1 | 2/2012 | Lu et al. |
| 2012/0074374 A1 | 3/2012 | Jo |
| 2012/0074507 A1 | 3/2012 | Jo et al. |
| 2012/0080798 A1 | 4/2012 | Harshfield |
| 2012/0104351 A1 | 5/2012 | Wei et al. |
| 2012/0108030 A1 | 5/2012 | Herner |
| 2012/0142163 A1 | 6/2012 | Herner |
| 2012/0145984 A1 | 6/2012 | Rabkin et al. |
| 2012/0155146 A1 | 6/2012 | Ueda et al. |
| 2012/0205606 A1 | 8/2012 | Lee et al. |
| 2012/0220100 A1 | 8/2012 | Herner |
| 2012/0235112 A1 | 9/2012 | Huo et al. |
| 2012/0250183 A1 | 10/2012 | Tamaoka et al. |
| 2012/0252183 A1 | 10/2012 | Herner |
| 2012/0305874 A1 | 12/2012 | Herner |

FOREIGN PATENT DOCUMENTS

| | | |
|---|---|---|
| JP | 2005-506703 A | 3/2005 |
| JP | 2006-032951 A | 2/2006 |
| JP | 2007-067408 A | 3/2007 |
| JP | 2007-281208 A | 10/2007 |
| JP | 2007-328857 A | 12/2007 |
| KR | 1020110014248 A | 2/2011 |
| WO | WO 03/034498 A1 | 4/2003 |
| WO | WO 2009/005699 A1 | 1/2009 |

OTHER PUBLICATIONS

Office Action for U.S. Appl. No. 12/835,699 dated Aug. 24, 2011.
Notice of Allowance for U.S. Appl. No. 12/835,699 dated Feb. 6, 2012.
Office Action for U.S. Appl. No. 12/833,898 dated Apr. 5, 2012.
European Search Report for Application No. EP 1100 5207.3 of Oct. 12, 2011.
Notice of Allowance for U.S. Appl. No. 12/833,898 dated May 30, 2012.
Notice of Allowance for U.S. Appl. No. 12/939,824 dated May 11, 2012.
Office Action for U.S. Appl. No. 12/913,719 dated Feb. 17, 2011.
Office Action for U.S. Appl. No. 12/913,719 dated Jul. 22, 2011.
Notice of Allowance for U.S. Appl. No. 12/913,719 dated Mar. 12, 2012.
Notice of Allowance for U.S. Appl. No. 12/940,920 dated Oct. 5, 2011.
Office Action for U.S. Appl. No. 13/314,513 dated Mar. 27, 2012.
Shong Yin, "Solution Processed Silver Sulfide Thin Films for Filament Memory Applications", Technical Report No. UCB/EECS-2010-166, http://www.eecs.berkeley.edu/Pubs/TechRpts/2010/EECS-2010-166.html, Dec. 17, 2010, Electrical Engineering and Computer Sciences, University of California at Berkeley.
Office Action for U.S. Appl. No. 13/149,653 dated Apr. 25, 2012.
International Search Report for PCT/US2011/045124 filed on Jul. 22, 2011.
Written Opinion of the International Searching Authority for PCT/US2011/045124 filed on Jul. 22, 2011.
Peng-Heng Chang et al, "Aluminum spiking at contact windows in Al/Ti-W/Si", Appl. Phys. Lett., Jan. 25, 1988, pp. 272-274, vol. 52 No. 4, American Institute of Physics.
J. Del Alamo et al, "Operating limits of Al-alloyed high-low junction for BSF solar cells", Solid-State Electronics, 1981, pp. 415-420, vol. 24, Pergamon Press Ltd., Great Britain.
Hao-Chih Yuan et al, "Silicon Solar Cells with Front Hetero-Contact and Aluminum Alloy Back Junction", NREL Conference Paper CP-520-42566, 33rd IEEE Photovoltaic Specialists Conference, May 11-16, 2008, National Renewable Energy Laboratory, San Diego, California.
International Search Report and Written Opinion for PCT/US2012/040242, filed May 31, 2012.
Office Action for U.S. Appl. No. 13/174,264 dated Mar. 6, 2013.
Office Action for U.S. Appl. No. 13/679,976, dated Mar. 6, 2013.
Notice of Allowance for U.S. Appl. No. 12/894,098, dated Mar. 15, 2013.
Office Action for U.S. Appl. No. 13/465,188, dated Mar. 19, 2013.
Office Action for U.S. Appl. No. 12/861,432 dated Mar. 29, 2013.
Notice of Allowance for U.S. Appl. No. 13/748,490, dated Apr. 9, 2013.
Office Action for U.S. Appl. No. 13/725,331, dated May 20, 2013.
International Search Report and Written Opinion for PCT/US2012/045312 filed on Jul. 2, 2012.
Office Action for U.S. Appl. No. 13/466,008, dated Jul. 29, 2013.
Russo, Ugo et al., "Self-Accelerated Thermal Dissolution Model for Reset Programming in Unipolar Resistive-Switching Memory (RRAM) Devices", IEEE Transactions on Electron Devices, Feb. 2009, pp. 193-200, vol. 56, Issue 2.
Cagli, C. et al., "Evidence for threshold switching in the set process of NiO-based RRAM and physical modeling for set, reset, retention and disturb prediction", IEEE International Electron Devices Meeting, Dec. 15-17, 2008, pp. 1-4, San Francisco, CA.
Office Action for U.S. Appl. No. 13/077,941, dated Aug. 12, 2013.
Office Action of U.S. Appl. No. 13/436,714 dated Aug. 27, 2013.
Notice of Allowance for U.S. Appl. No. 13/679,976, dated Sep. 17, 2013.
Office Action for U.S. Appl. No. 13/189,401 dated Sep. 30, 2013.
Office Action for U.S. Appl. No. 13/462,653 dated Sep. 30, 2013.
Corrected Notice of Allowability for U.S. Appl. No. 13/733,828, dated Oct. 1, 2013.
Notice of Allowance for U.S. Appl. No. 13/733,828, dated Aug. 8, 2013.
Office Action for U.S. Appl. No. 13/594,665 dated Aug. 2, 2013.
Notice of Allowance for U.S. Appl. No. 13/769,152, dated Oct. 8, 2013.
Notice of Allowance for U.S. Appl. No. 13/905,074 , dated Oct. 8, 2013.
Notice of Allowability for U.S. Appl. No. 13/452,657, dated Oct. 10, 2013.

(56) References Cited

OTHER PUBLICATIONS

Notice of Allowance for U.S. Appl. No. 13/174,264, dated Oct. 16, 2013.
Notice of Allowability for U.S. Appl. No. 13/417,135, dated Oct. 23, 2013.
Notice of Allowance for U.S. Appl. No. 12/939,824 dated Jul. 24, 2012.
Office Action for U.S. Appl. No. 13/564,639, dated Mar. 19, 2013.
John S. Suehle et al. "Temperature dependence of soft breakdown and wear-out in Sub-3 nm $SiO_2$ films", 38th Annual International Reliability Physics Symposium, 2000, pp. 33-34, San Jose, California.
Woonki Shin et al. "Effect of Native Oxide on Polycrystalline Silicon CMP", Journal of the Korean Physical Society, Mar. 2009, pp. 1077-1081, vol. 54, No. 3.
Office Action for U.S. Appl. No. 13/447,036 dated Jul. 9, 2013.
Office Action for U.S. Appl. No. 13/764,698 dated Jul. 11, 2013.
Office Action for U.S. Appl. No. 13/481,600 dated Sep. 20, 2013.
Office Action for U.S. Appl. No. 13/564,639 dated Dec. 6, 2013.
Office Action for U.S. Appl. No. 13/156,232, dated Nov. 26, 2012.
Notice of Allowance for U.S. Appl. No. 13/290,024 dated Nov. 28, 2012.
Notice of Allowance for U.S. Appl. No. 12/814,410 dated Jan. 8, 2013.
Corrected Notice of Allowance for U.S. Appl. No. 12/861,666 dated Jan. 11, 2013.
Supplemental Notice of Allowance for U.S. Appl. No. 12/894,087 dated Jan. 11, 2013.
Notice of Allowance for U.S. Appl. No. 13/314,513 dated Jan. 24, 2013.
Notice of Allowance for U.S. Appl. No. 13/118,258, dated Feb. 6, 2013.
Office Action for U.S. Appl. No. 13/149,653 dated Nov. 20, 2012.
Office Action of U.S. Appl. No. 13/436,714 dated Dec. 7, 2012.
Jian Hu et al., "Area-Dependent Switching in Thin Film-Silicon Devices", Materials Research Society, Mal. Res. Soc. Symp Proc., 2003, pp. A18.3.1-A18.3.6, vol. 762.
AndréDehon, "Array-Based Architecture for FET-Based, Nanoscale Electronics", IEEE Transactions on Nanotechnology, Mar. 2003, pp. 23-32, vol. 2, No. 1, IEEE.
Herb Goronkin et al., "High-Performance Emerging Solid-State Memory Technologies", MRS Bulletin, www.mrs.org/publications/bulletin, Nov. 2004, pp. 805-813.
Gerhard Müller et al., "Status and Outlook of Emerging Nonvolatile Memory Technologies", IEEE, 2004, pp. 567-570.
A.E. Owen et al., "Memory Switching in Amorphous Silicon Devices", Journal of Non-Crystalline Solids 59 & 60,1983, pp. 1273-1280, North Holland Publishing Company/Physical Society of Japan.
J. Campbell Scott, "Is There an Immortal Memory?", www.sciencemag.org, Apr. 2, 2004, pp. 62-63, vol. 304 No. 5667, American Association for the Advancement of Science.
S.H. Lee et al., "Full Integration and Cell Characteristics for 64Mb Nonvolatile PRAM", 2004 Symposium on VLSI Technology Digest of Technical Papers, IEEE, 2004, pp. 20-21.
Stephen Y. Chou et al., "Imprint Lithography With 25-Nanometer Resolution", Science, Apr. 5, 1996, pp. 85-87, vol. 272, American Association for the Advancement of Science.
S. Zankovych et al., "Nanoimprint Lithography: challenges and prospects", Nanotechnology, 2001, pp. 91-95, vol. 12, Institute of Physics Publishing.
A. Avila et al., "Switching in coplanar amorphous hydrogenated silicon devices", Solid-State Electronics, 2000, pp. 17-27, vol. 44, Elsevier Science Ltd.
Jian Hu et al., "Switching and filament formation in hot-wire CVD p-type a-Si:H devices", Thin Solid Films, Science Direct, www.sciencedirect.com, 2003, pp. 249-252, vol. 430, Elsevier Science B.V.

S. Hudgens et al., "Overview of Phase-Change Chalcogenide Nonvolatile Memory Technology", MRS Bulletin, www.mrs.org/publications/bulletin, Nov. 2004, pp. 829-832.
K. Terabe et al., "Quantized conductance atomic switch", Nature, www.nature.com/nature, Jan. 6, 2005, pp. 47-50, vol. 433, Nature Publishing Group.
Michael Kund et al., "Conductive bridging RAM (CBRAM): An emerging non-volatile memory technology scalable to sub 20nm", IEEE, 2005.
W. Den Boer, "Threshold switching in hydrogenated amorphous silicon", Appl. Phys. Letter, 1982, pp. 812-813, vol. 40, American Institute of Physics.
P.G. Lecomber et al., "The Switching Mechanism in Amorphous Silicon Junctions", Journal of Non-Crystalline Solids,1985, pp. 1373-1382, vol. 77 & 78, Elsevier Science Publishers B.V., North Holland Physics Publishing Division, North-Holland, Amsterdam.
A. E. Owen et al., "Switching in amorphous devices", Int. J. Electronics, 1992, pp. 897-906, vol. 73, No. 5, Taylor and Francis Ltd.
M. Jafar et al., "Switching in amorphous-silicon devices", Physical Review B, May 15, 1994, pp. 611-615, vol. 49, No. 19, The American Physical Society.
Alexandra Stikeman, "Polymer Memory—The plastic path to better data storage", Technology Review, www.technologyreview.com, Sep. 2002, pp. 31.
Yong Chen et al., "Nanoscale molecular-switch crossbar circuits", Nanotechnology, 2003, pp. 462-468, vol. 14, Institute of Physics Publishing Ltd.
C. P. Collier et al., "Electronically Configurable Molecular-Based Logic Gates", Science Jul. 16, 1999, pp. 391-395, vol. 285, No. 5426, American Association for the Advancement of Science.
Office Action for U.S. Appl. No. 11/875,541 dated Jul. 22, 2010.
Office Action for U.S. Appl. No. 11/875,541 dated Mar. 30, 2011.
Office Action for U.S. Appl. No. 11/875,541 dated Oct. 5, 2011.
Office Action for U.S. Appl. No. 11/875,541 dated Jun. 8, 2012.
Jang Wook Choi, "Bistable [2]Rotaxane Based Molecular Electronics: Fundamentals and Applications", Dissertation, Chapter 3, <http://resolver.caltech.edu/CaltechETD:etd-05242007-194737> 2007, pp. 79-120, California Institute of Technology, Pasadena.
Sung-Hyun Jo et al., "A Silicon-Based Crossbar Ultra-High-Density Non-Volatile Memory", SSEL Annual Report 2007.
International Search Report for PCT/US2009/060023 filed on Oct. 8, 2009.
Rainer Waser et al., "Nanoionics-based resistive switching memories", Nature Materials, Nov. 2007, pp. 833-835, vol. 6, Nature Publishing Group.
Written Opinion of the International Searching Authority for PCT/US2009/060023 filed on Oct. 8, 2009.
Ex parte Quayle Action for U.S. Appl. No. 12/826,653 dated May 8, 2012.
International Search Report for PCT/US2011/040090 filed on Jun. 10, 2011.
Written Opinion of the International Searching Authority for PCT/US2011/040090 filed on Jun. 10, 2011.
Notice of Allowance for U.S. Appl. No. 13/158,231 dated Apr. 17, 2012.
Office Action for U.S. Appl. No. 12/835,704 dated Sep. 21, 2011.
Office Action for U.S. Appl. No. 12/835,704 dated Mar. 1, 2012.
Advisory Action for U.S. Appl. No. 12/835,704 dated Jun. 8, 2012.
International Search Report and Written Opinion for PCT/US2011/046035 filed on Jul. 29, 2011.
Office Action for U.S. Appl. No. 12/861,650 dated Jan. 25, 2012.
Notice of Allowance for U.S. Appl. No. 12/861,650 dated Jun. 19, 2012.
Sung Hyun Jo et al., "Programmable Resistance Switching in Nanoscale Two-Terminal Devices," Supporting Information, Dec. 29, 2008, pp. 1-4, vol. 9., No. 1, Department of Electrical Engineering and Computer Science, the University of Michigan, Ann Arbor, Michigan.
Kuk-Hwan Kim et al., "Nanoscale resistive memory with intrinsic diode characteristics and long endurance," Applied Physics Letters, 2010, pp. 053106-1-053106-3, vol. 96, American Institute of Physics.

(56) References Cited

OTHER PUBLICATIONS

Sung Hyun Jo et al., "Si-Based Two-Terminal Resistive Switching Nonvolatile Memory", IEEE, 2008.
Sung Hyun Jo et al., "Nanoscale Memristor Device as Synapse in Neuromorphic Systems", Nano Letters, 10, 1297-1301, 2010, pubs.acs.org/NanoLett, A-E, American Chemical Society Publications.
Wei Lu et al., "Nanoelectronics from the bottom up", Nature Materials, www.nature.com/naturematerials, Nov. 2007, pp. 841-850, vol. 6, Nature Publishing Group.
Sung Hyun Jo et al., "Ag/a-Si:H/c-Si Resistive Switching Nonvolatile Memory Devices", Nanotechnology Materials and Devices Conference, IEEE, 2006, pp. 116-117, vol. 1.
Sung Hyun Jo et al., "Experimental, Modeling and Simulation Studies of Nanoscale Resistance Switching Devices", $9^{th}$ Conference on Nanotechnology, IEEE, 2009, pp. 493-495.
Sung Hyun Jo et al., "Nonvolatile Resistive Switching Devices Based on Nanoscale Metal/Amorphous Silicon/Crystalline Silicon Junctions", Mater. Res. Soc. Symp. Proc., 2007, vol. 997, Materials Research Society.
Sung Hyun Jo et al., "Si Memristive Devices Applied to Memory and Neuromorphic Circuits", Proceedings of 2010 IEEE International Symposium on Circuits and Systems, 2010, pp. 13-16.
Wei Lu et al., "Supporting Information", 2008.
Sung Hyun Jo et al., "High-Density Crossbar Arrays Based on a Si Memristive System", Nano Letters, 2009, pp. 870-874, vol. 9 No. 2, American Chemical Society Publications.
Sung Hyun Jo et al., "High-Density Crossbar Arrays Based on a Si Memristive System", Supporting Information, 2009, pp. 1-4.
Sung Hyun Jo et al., "Programmable Resistance Switching in Nanoscale Two-Terminal Devices", Nano Letters, 2009, pp. 496-500, vol. 9 No. 1, American Chemical Society Publications.
Shubhra Gangopadhyay et al., "Memory Switching in Sputtered Hydrogenated Amorphous Silicon (a-Si:H)", Japanese Journal of Applied Physics, Short Notes, 1985, pp. 1363-1364, vol. 24 No. 10.
S. K. Dey, "Electrothermal model of switching in amorphous silicon films", J. Vac. Sci. Technol., Jan./Feb. 1980, pp. 445-448, vol. 17, No. 1, American Vacuum Society.
J. Hajto et al., "The Programmability of Amorphous Silicon Analogue Memory Elements", Mat. Res. Soc. Symp. Proc., 1990, pp. 405-410, vol. 192, Materials Research Society.
M. J. Rose et al., "Amorphous Silicon Analogue Memory Devices", Journal of Non-Crystalline Solids, 1989, pp. 168-170, vol. 115, Elsevier Science Publishers B.V., North-Holland.
A. Moopenn et al., "Programmable Synaptic Devices for Electronic Neural Nets", Control and Computers, 1990, pp. 37-41, vol. 18 No. 2.
P.G. Le Comber, "Present and Future Applications of Amorphous Silicon and Its Alloys", Journal of Non-Crystalline Solids, 1989, pp. 1-13, vol. 115, Elsevier Science Publishers B.V., North-Holland.
J. Hu, et al., "AC Characteristics of Cr/p+a-Si:H/V Analog Switching Devices", IEEE Transactions on Electron Devices, Sep. 2000, pp. 1751-1757, vol. 47 No. 9, IEEE.
A.E. Owen et al., "New amorphous-silicon electrically programmable nonvolatile switching device", Solid-State and Electron Devices, IEEE Proceedings, Apr. 1982, pp. 51-54, vol. 129, Pt. I., No. 2.
J. Hajto et al., "Amorphous & Microcrystalline Semiconductor Devices: vol. 2, Materials and Device Physics", Mar. 1, 2004, pp. 640-700, Artech House Publishers.
J. Hajto et al., "Analogue memory and ballistic electron effects in metal-amorphous silicon structures", Philosophical Magazine B, 1991, pp. 349-369, vol. 63 No. 1, Taylor & Francis Ltd.
A. J. Holmes et al., "Design of Analogue Synapse Circuits using Non-Volatile a-Si:H Memory Devices", Proceedings of ISCAS, 1994, pp. 351-354.
Yajie Dong et al., "Si/a-Si Core/Shell Nanowires as Nonvolatile Crossbar Switches", Nano Letters, Jan. 2008, pp. 386-391, vol. 8 No. 2, American Chemical Society.
European Search Report for Application No. EP 09 81 9890.6 of Mar. 27, 2012.
D. A. Muller et al., "The Electronic structure at the atomic scale of ultrathin gate oxides", Nature, Jun. 24, 1999, pp. 758-761, vol. 399.
J. Suñé et al., "Nondestructive multiple breakdown events in very thin $SiO_2$ films", Applied Physics Letters, 1989, pp. 128-130, vol. 55.
Herve Marand et al., MESc. 5025 lecture notes: Chapter 7. Diffusion, University of Vermont, http://www.files.chem.vt.edu/chem-dept/marand/MEScchap6-1c.pdf.
A. E. Owen et al., "Electronic Switching in Amorphous Silicon Devices: Properties of the Conducting Filament", Proceedings of 5th International Conference on Solid-State and Integrated Circuit Technology, IEEE, 1998, pp. 830-833.
Sung Hyun Jo, "Nanoscale Memristive Devices for Memory and Logic Applications", Ph. D dissertation, University of Michigan, 2010.
Office Action for U.S. Appl. No. 12/894,098 dated Aug. 1, 2012.
Sung Hyun Jo et al., "CMOS Compatible Nanoscale Nonvolatile Resistance Switching Memory", Nano Letters, 2008, pp. 392-397, vol. 8, No. 2.
Office Action for U.S. Appl. No. 12/582,086 dated Apr. 19, 2011.
Office Action for U.S. Appl. No. 12/582,086 dated Sep. 6, 2011.
Notice of Allowance for U.S. Appl. No. 12/582,086 dated Oct. 21, 2011.
International Search Report for PCT/US2009/061249 filed on Oct. 20, 2009.
Written Opinion of the International Searching Authority for PCT/US2009/061249 filed on Oct. 20, 2009.
Office Action for U.S. Appl. No. 12/861,650 dated Oct 16, 2012.
Notice of Allowance for U.S. Appl. No. 12/894,087 dated Oct. 25, 2012.
Notice of Allowance for U.S. Appl. No. 13/149,807 dated Oct. 29, 2012.
Notice of Allowance for U.S. Appl. No. 12/861,666 dated Nov. 14, 2012.
Office Action for Application No. EP 1100 5207.3 dated Aug. 8, 2012.
Office Action for U.S. Appl. No. 13/417,135 dated Oct. 9, 2012.
Notice of Allowance for U.S. Appl. No. dated Nov. 14, 2012.
Office Action for U.S. Appl. No. 12/835,704, dated Mar. 14, 2014.
Office Action for U.S. Appl. No. 13/870,919, Dated Apr. 3, 2014.
Office Action for U.S. Appl. No. 13/167,920, dated Mar. 12, 2014.
International Search Report and Written Opinion for PCT/US2013/077628, filed on Dec. 23, 2013.
Notice of Allowance for U.S. Appl. No. 13/725,331, dated Jan. 17, 2014.
Office Action for U.S. Appl. No. 13/739,283, dated Jan. 16, 2014.
Office Action for U.S. Appl. No. 13/920,021, dated Jan. 10, 2014.
Office Action for U.S. Appl. No. 12/861,432, dated Jan. 8, 2014.
Office Action for U.S. Appl. No. 13/586,815, dated Jan. 29, 2014.
International Search Report and Written Opinion for PCT/US2013/061244, filed on Sep. 23, 2013.

SILVER INTERCONNECTS FOR STACKED NON-VOLATILE MEMORY DEVICE AND METHOD

CROSS REFERENCE TO RELATED APPLICATIONS

This application claims priority to provisional application 61/428,982 filed Dec. 31, 2010, commonly assigned and incorporated by reference in its entirety herein.

BACKGROUND OF THE PRESENT INVENTION

The present invention is generally related to resistive switching devices. More particularly, embodiments according to the present invention provide a method and a structure for forming an interconnect structure for a stacked resistive switching device. The present invention can be applied to non-volatile memory devices but it should be recognized that the present invention can have a much broader range of applicability.

The success of semiconductor devices has been mainly driven by an intensive transistor down-scaling process. However, as field effect transistors (FET) approach sizes less than 100 nm, problems such as the short channel effect degrade device performance. Moreover, such sub 100 nm device sizes can lead to sub-threshold slope non-scaling and increase in power dissipation. It is generally believed that transistor-based memories such as those commonly known as Flash may approach an end to scaling within a decade. Flash memory is one type of non-volatile memory device.

Other non-volatile random access memory (RAM) devices such as ferroelectric RAM (Fe RAM), magneto-resistive RAM (MRAM), organic RAM (ORAM), and phase change RAM (PCRAM), among others, have been explored as next generation memory devices. These devices often require new materials and device structures to couple with silicon-based devices to form a memory cell, which lack one or more key attributes. For example, Fe-RAM and MRAM devices have fast switching characteristics and good programming endurance, but their fabrication is not CMOS compatible and size is usually large. Switching a PCRAM device requires a large amount of power. Organic RAM or ORAM is incompatible with large volume silicon-based fabrication and device reliability is usually poor.

From the above, a new semiconductor device structure and integration is desirable

BRIEF SUMMARY OF THE PRESENT INVENTION

The present invention is generally related to resistive switching devices. More particularly, embodiments according to the present invention provide a method and a structure for forming an interconnect structure for a resistive switching device. The present invention can be applied to non-volatile memory devices but it should be recognized that the present invention can have a much broader range of applicability.

In a specific embodiment, a method of forming interconnects for a non-volatile memory device is provided. The method includes providing a substrate having a surface region and forming a first thickness of dielectric material overlying the surface region. The method includes subjecting the first thickness of dielectric material to a first patterning and etching process to form a plurality of opening structures in a portion of the first dielectric material. A first lining material is formed conformably overlying each of the plurality of opening structures. In a specific embodiment, the method includes depositing a first silver material to fill each of the plurality of opening structures and forming a thickness of silver material overlying the first dielectric material. A second adhesion material is formed overlying the thickness of silver material and a contact material is formed overlying the second adhesion material. In a specific embodiment, the method includes depositing a switching material comprising an amorphous silicon material overlying the contact material. The switching material, the contact material, and the silver material are subjected to a second patterning and etching process to form one or more first structures. Each of the one or more first structures includes at least a bottom wiring structure from at least the first silver material in a specific embodiment. The one or more bottom wiring structure is configured to spatially extend in a first direction in a specific embodiment. A thickness of second dielectric material is deposited overlying the one or more first structures. The method includes subjecting the second dielectric material to a third patterning and etching process to form at least one via openings in a portion of the second dielectric material to expose a surface region of the switching material. In a specific embodiment, the method includes depositing a second wiring material comprising a second silver material to fill the at least one via openings and to form a thickness of second wiring material overlying the second dielectric material. The second wiring material is subjected to a fourth patterning and etching process to form a top wiring structure spatially extending in a second direction orthogonal to the first direction in a specific embodiment.

In a specific embodiment, a non-volatile memory device structure is provided. The non-volatile memory device includes a semiconductor substrate having a surface region and a first dielectric material overlying the surface region of the semiconductor substrate. The device includes a bottom wiring structure comprising at least a first silver material overlying the first dielectric material. In a specific embodiment, the bottom wiring structure is configured to spatially extend in a first direction. The device includes a contact material comprising a p+ polysilicon material overlying the bottom wiring structure and a switching material comprising an amorphous silicon material overlying the contact material. A top wiring structure comprising at least a second silver material overlies the switching material. In a specific embodiment, the top wiring structure is configured to spatially extend in a second direction orthogonal to the first direction.

In a specific embodiment, a non-volatile memory device is provided. The non-volatile memory device includes a semiconductor substrate having a surface region and a first dielectric material overlying the surface region of the semiconductor substrate. The non-volatile memory device includes a first crossbar array of memory cells. The first crossbar array of memory cells includes a first bottom wiring structure comprising a first silver material spatially extending in a first direction, a first top wiring structure comprising a second silver material spatially extending in a second direction orthogonal to the first direction, and a first switching region comprising an amorphous silicon material sandwiched between the first wiring structure and the second wiring structure. A second dielectric material overlies the first crossbar array of memory cells. The non-volatile memory device includes a second crossbar array of memory cells overlying the second dielectric material. The second crossbar array of memory cells includes at least a second bottom wiring structure comprising a third silver material spatially extending in the first direction, a second top wiring structure comprising a fourth silver material spatially extending in the second direction, and a second switching region sandwiched between the second bottom wiring structure and the second top wiring structure. The non-volatile memory device can have N crossbar arrays of memory cells, where N is an integer ranging from 1 to 8. In a specific embodiment, an Nth crossbar array of memory cells is isolated from an (N−1)th crossbar array of memory cells by an Nth dielectric material.

Many benefits can be achieved by ways of the present invention. For example, the present method uses a silver material for interconnect structure to lower resistance in the circuitry of the non-volatile memory device to enhance device performance and decrease device size. By using silver as the interconnect material, which is also a material used in a memory cell, would greatly simplify process and increases device yield. Moreover, a reduced thickness of an interconnect wiring can be used due to the higher electric conductivity of silver. A reduced thickness in silver would require less photoresist for pattern and etch. A thinner photoresist is required as device size shrinks. In other embodiments, the method provides a way to form a multilayer vertically stacked non-volatile memory device characterized by high density and reduced feature size.

SUMMARY OF THE DRAWINGS

FIGS. 1-7, 7(a), 8, 8(a), 9, 9(a), 10, and 10(a) are simplified diagrams illustrating a method of forming a nonvolatile memory device according to embodiments of the present invention.

DETAILED DESCRIPTION OF THE PRESENT INVENTION

Figure 1:

The present invention is directed to memory device. More particularly, embodiments according to the present invention provide a method and a structure for forming an interconnect structure for a memory device. Embodiments according to the present invention have been applied to a non-volatile memory device. But it should be recognized that the present invention can have a much broader range of applicability.

Resistive switching behavior has been observed and studied in micrometer-scale amorphous silicon (a-Si) devices since the 1980s. A typical device consists of a pair of metal electrodes sandwiching an amorphous-Si layer in a so-called Metal/a-Si/Metal (M/a-Si/M) structure, in which the voltage applied across the pair of metal electrodes causes changes in the a-Si resistance. These conventional M/a-Si/M based non-volatile switching devices have the advantages of high Ion/Ioff ratios, and can be fabricated with a CMOS compatible fabrication process and materials.

To further decrease cost per bit, device shrinking and process simplification is necessary. To achieve smaller device size, interconnect thickness would have to be reduced. A thinner metal line has many advantages in processing, for example, during patterning and etch, less photoresist is needed, less metal material needs to be removed, and device yield is improved. Silver has a low resistivity which improves device performance and therefore reduces the size of an integrated memory product (>1 Mbit). Additionally, as silver is used in the resistive switching device, the total number of process steps can be reduced.

The terms "bottom" and "top" are for references only and not meant to be limiting. Like reference numerals are used and also not meant to be limiting.

Figure 2:
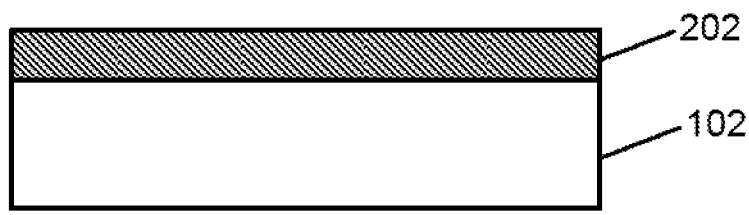

Embodiments according to the present invention provide a method and a structure for forming interconnects for a crossbar array of memory cells. Referring to FIG. 1, a semiconductor substrate 102 is provided. The semiconductor substrate can include a single crystal silicon, silicon germanium, or a silicon on insulator (commonly known as SOI) substrate. In a specific embodiment, the semiconductor substrate can further include one or more transistor devices formed thereon. The one or more transistor devices provide controlling circuitry for the memory device in a specific embodiment. As shown in FIG. 2, a metal, interconnect structure from the controlling circuitry is formed overlying the substrate in a specific embodiment.

Figure 3:
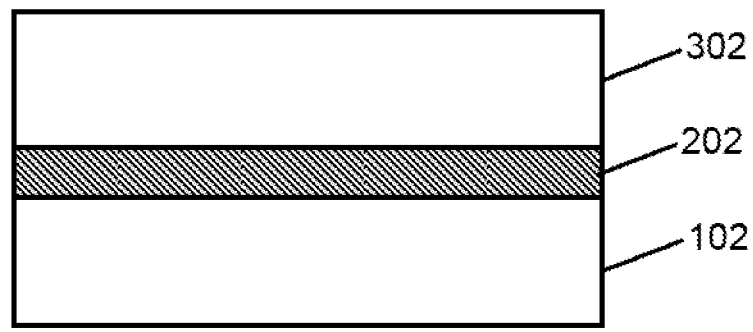

In a specific embodiment, the method includes forming a first dielectric material 302 overlying the substrate including the first metal interconnect structure as shown in FIG. 3. The first dielectric material can be a silicon oxide, a silicon nitride, a silicon oxide on silicon nitride on silicon oxide stack (ONO), a high K dielectric material, a low K dielectric material, and others, depending on the embodiment. The first dielectric material can be deposited using a chemical vapor deposition (CVD) process, including plasma enhanced CVD, low pressure CVD, spin on glass (SOG), physical vapor deposition (PVD) process, or any combination of these. The silicon oxide material can be doped using boron, phosphorous, fluorine or other material or a combination of materials to provide for a suitable and desirable characteristic (for example, dielectric constant) depending on the application.

Figure 4:
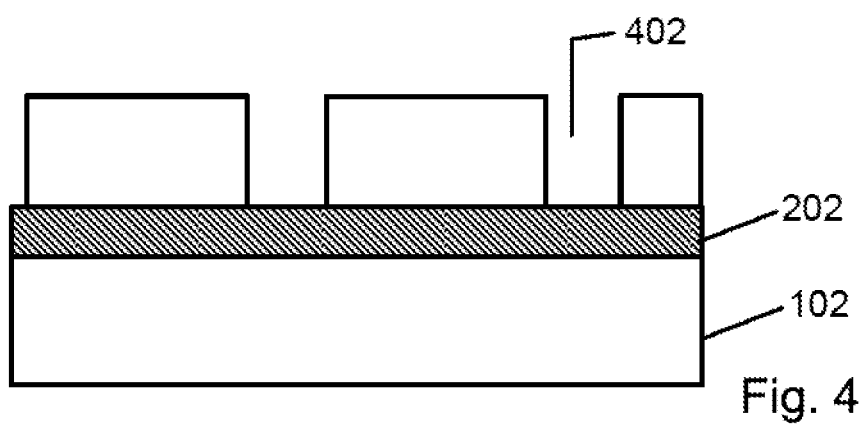
Figure 5:
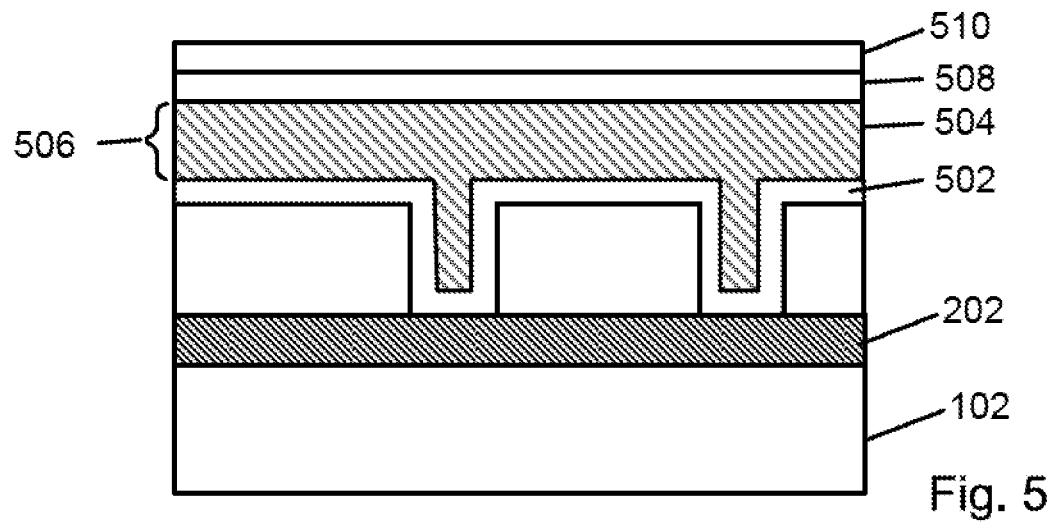

Referring to FIG. 4, the method subjects the first dielectric material to a first pattern and etch process to form a plurality of first opening 402. Referring to FIG. 5, a first lining material 502 is conformally formed overlying each of the plurality of via openings. The first lining material can be a diffusion barrier material or an adhesion layer or a combination. The first lining material can be titanium, titanium nitride, tantalum nitride, tungsten nitride and the likes, depending on the embodiment. In other embodiment, the first lining material can further include a dielectric material, for example, a silicon carbide material. A first wiring material 504 is deposited to fill each of the plurality of first openings and to form a thickness of first wiring material 506 overlying the first dielectric material in a specific embodiment. The first wiring material can include tungsten, aluminum, copper or a suitably doped polysilicon material. In a specific embodiment, the first wiring material is a first silver material. The first silver material can be deposited using techniques such as a chemical vapor deposition process, a physical vapor deposition process, an electroplating process, an electroless deposition process, including any combination of theses, and others. One skilled in the art would recognize other variations, modifications, and alternatives.

Referring again to FIG. 5, in a specific embodiment, the method includes depositing a contact material 508 overlying the first wiring material and a resistive switching material 510 is formed overlying the contact material to simultaneously form a first part of the memory device and a wiring structure. For amorphous silicon as the resistive switching material, the contact material can be a polysilicon material in a specific embodiment. The polysilicon material controls a defect density in an interface region overlying the bottom wiring material in a specific embodiment. The polysilicon material is configured to have a suitable conductivity and a suitable contact resistance between the amorphous silicon material and the first wiring material in a specific embodiment. The polysilicon material is doped to have a p+-type impurity characteristic in a specific embodiment. Additionally, for first silver material as the first wiring material, a barrier material (not shown) can be provided overlying the contact material interposing between the contact material and the first wiring material. The barrier material prevents the first silver material to diffuse into the resistive switching material or other parts of the device to interfere with proper switching of the device. In certain embodiments, the contact material can be optional.

Figure 6:
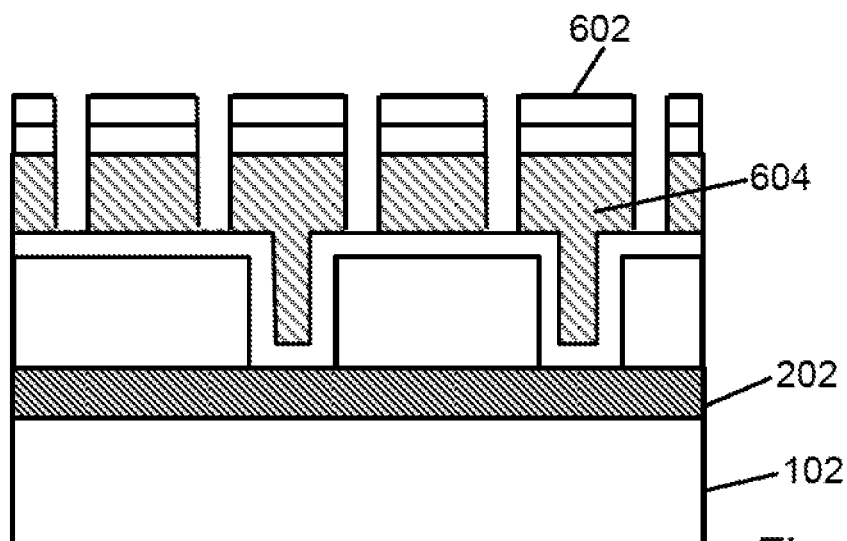
Figure 7:
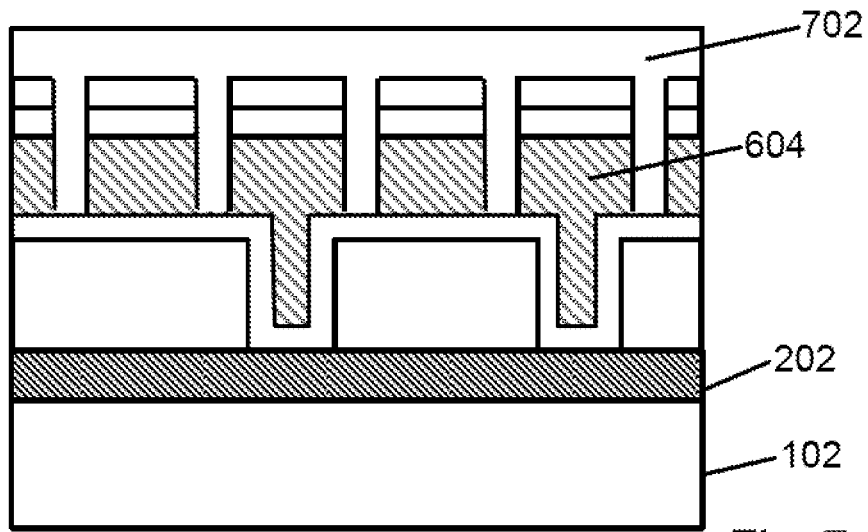
Figure 7A:
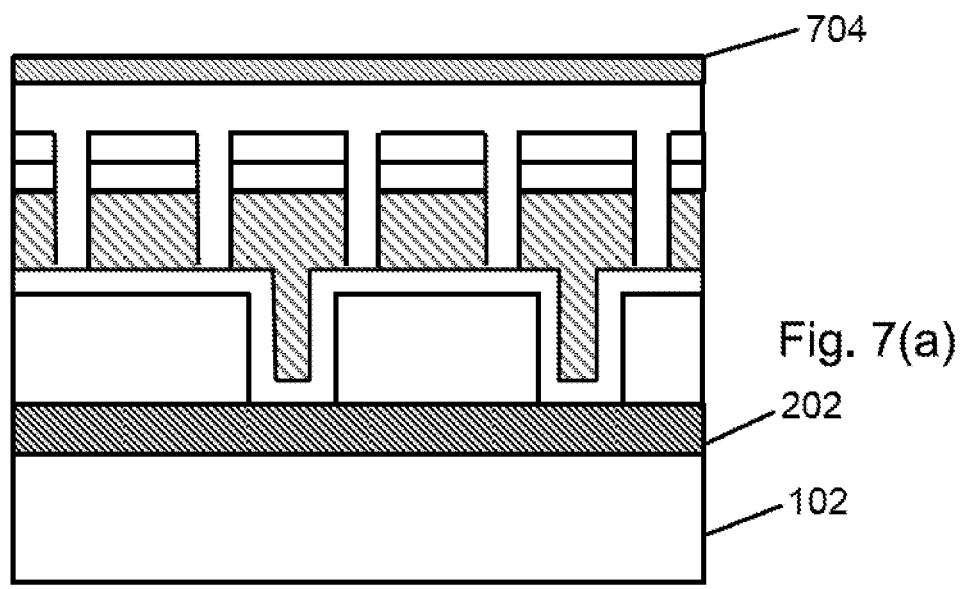

Referring to FIG. 6, the method subjects the resistive switching material, the contact material, and the first wiring material to a second pattern and etch process to form a plurality of first structures. The first structure including a switching element 602 associated with a resistive switching device and a first wiring structure 604 in a specific embodiment. The bottom wiring structure is elongated in shape and configured to extend in a first direction in a specific embodiment. The first wiring structure includes the first silver material in a specific embodiment. Depending on the embodiment, the switching material can be further etched to form one or more isolated and discrete switching elements to prevent disturb between the switching devices In a specific embodiment, the method forms a third dielectric material 702 overlying the first structure and fills a gap region between the first structures as shown in FIG. 7. The third dielectric material can be silicon oxide, silicon nitride, a multilayer dielectric stack having alternating layers of silicon oxide and silicon nitride (for example, an ONO stack), a high K dielectric, or a low K dielectric including a combination. The third dielectric material may be subjected to a planarizing process to form a planarized surface in certain embodiment. The planarization process can be an etch back process or a chemical mechanical polishing process or a combination, depending on the application. As shown, each of the switching element is isolated by the third dielectric material and disturbs between neighboring switching element is thus inhibited. As shown in FIG. 7a, the method includes depositing an adhesion material 704 overlying the third dielectric material. Adhesion material 704 can be titanium, titanium nitride, tantalum nitride, tungsten nitride depending on the application.

Figure 8:
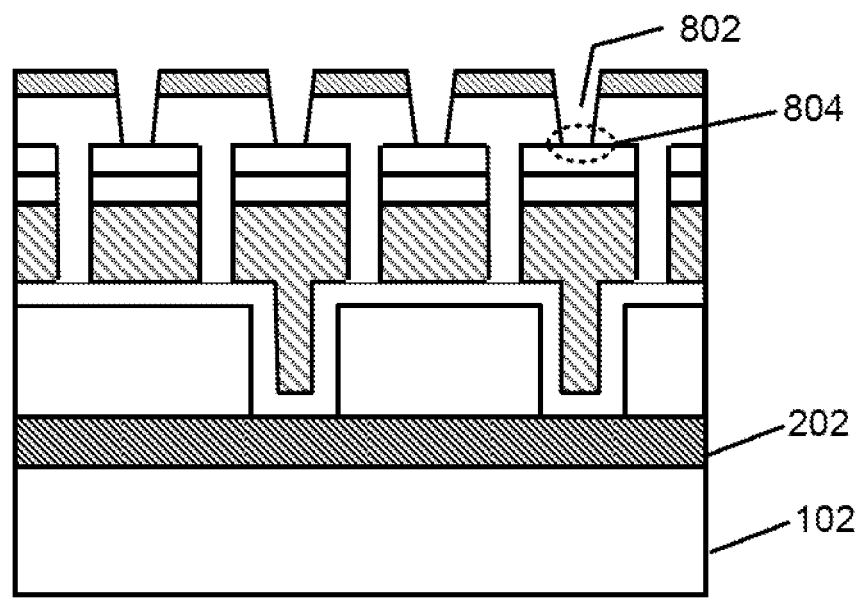

Referring to FIG. 8. The method includes subjecting adhesion material 704 and the third dielectric material to a third patterning and etch process to form a plurality of via openings 802 in portions of the third dielectric material and to expose a surface region 804 of the switching material in each of the first structure.

Figure 8A:
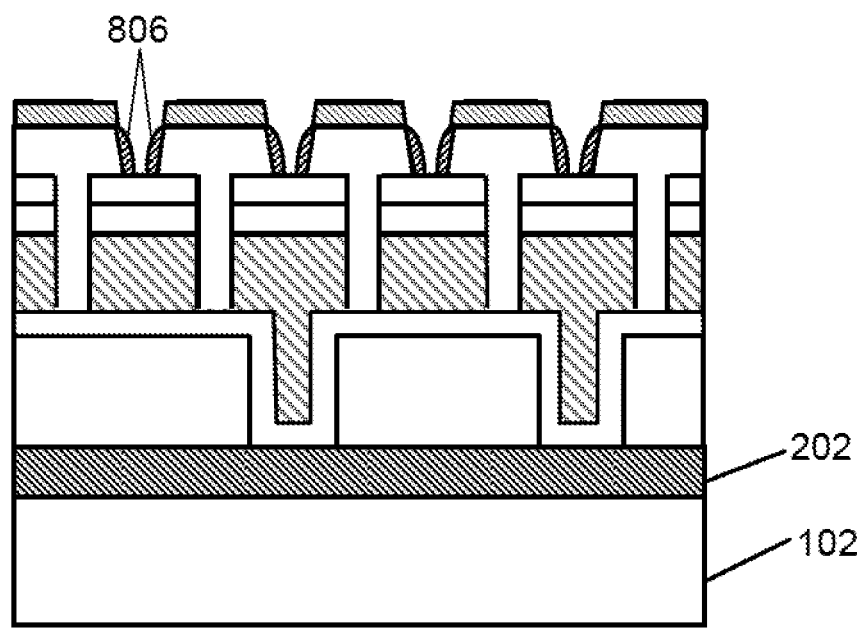

Depending on the embodiment, there can be other variations. For example, a sidewall spacer structure 806 can be formed overlying a portion of each of the plurality of via opening as shown in FIG. 8(a). The sidewall spacer structure is formed by depositing a suitable dielectric material followed by a patterning and etching process. The dielectric material can be silicon nitride, silicon oxide and the like, depending on the embodiment.

Figure 9A:
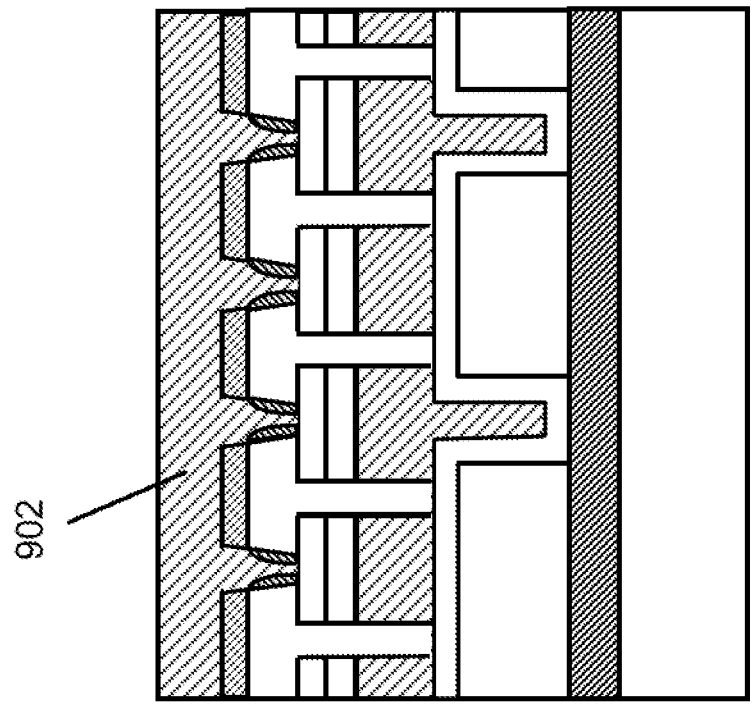
Figure 9:
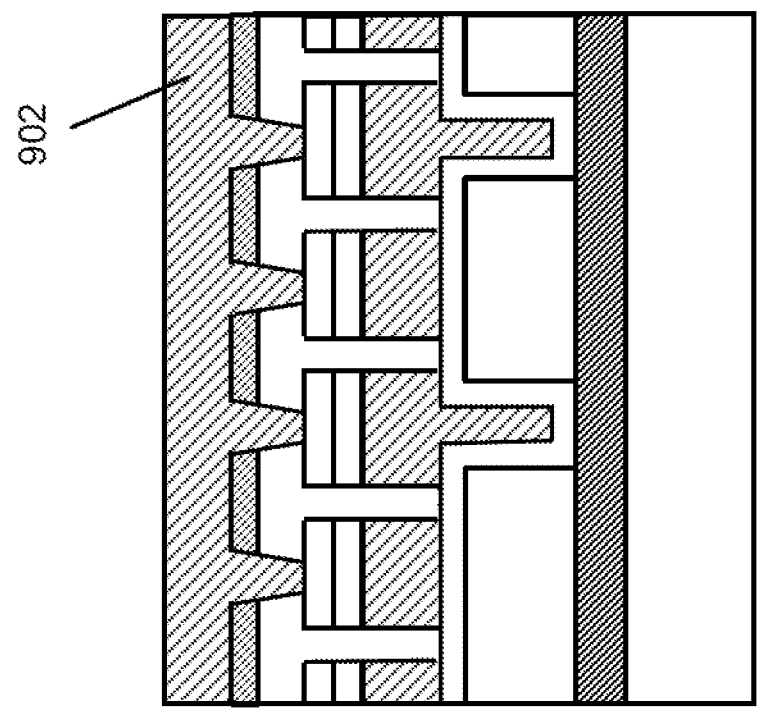

As shown in FIG. 9, the method includes depositing a second wiring material 902 overlying the adhesion material and the third dielectric material and to fill each of the plurality of via openings. The second wiring material is a silver material in a specific embodiment. The silver material can be deposited using techniques such as a chemical vapor deposition process, a physical vapor deposition process, an electroplating process, an electroless deposition process, including any combination of theses, and others. In some embodiments, the silver material is in direct contact with the amorphous silicon in a specific embodiment. In other embodiments, a thin layer of oxide, is formed prior to the deposition of the silver material on top of the amorphous silicon. This interposing thin layer of oxide may be naturally or specifically grown or formed, and one or more etch operations (e.g. HF etch, Argon etch) may help control the thickness of this oxide layer. In some embodiments, the thickness of the oxide prior to deposition of the silver material may range from about 20 angstroms to about 50 angstroms; in other embodiments, the thickness may range from about 30 angstroms to about 40 angstroms; or the like. FIG. 9(a) illustrates the embodiment having the sidewall spacer structure.

Figure 10:
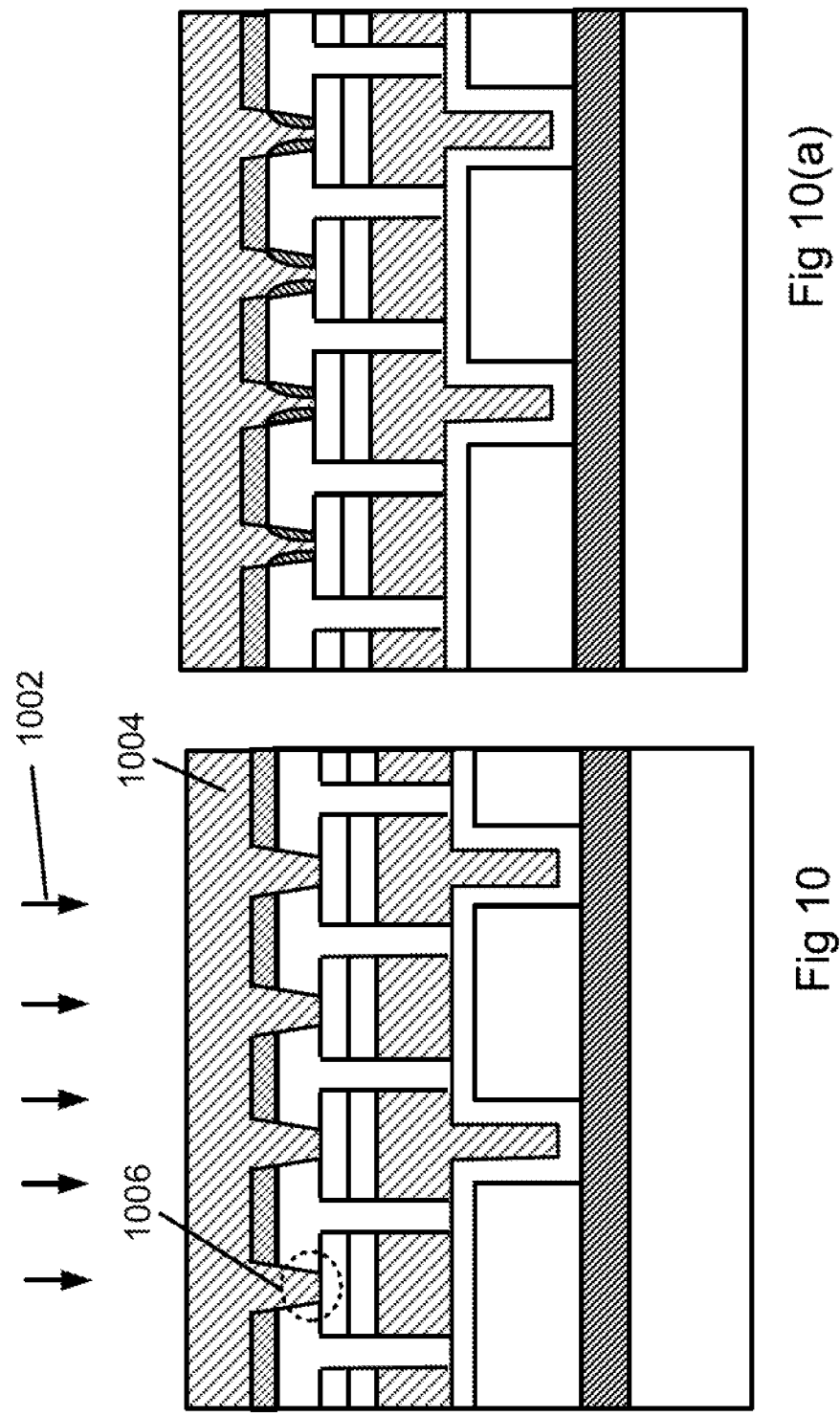

The method subjects the second wiring material to a fourth patterning and etching process 1002 to form a plurality of second wiring structure 1004 while the second wiring material remains in contact with the switching material. Prior to the fourth patterning and etching process, an anti-reflective coating (commonly called ARC) is deposited on the second wiring material to reduce reflection from a highly reflective, for example, silver surface. The antireflective coating can include titanium nitride, or silicon oxynitride, or others, depending on the embodiment. In a specific embodiment, the second wiring structure is spatially configured to extend in a second direction at an angle to the first direction. In a specific embodiment, the second direction is orthogonal to the first direction. As shown, a switching region 1006 comprising the amorphous silicon material is formed in an intersection region between the first wiring structure and the second wiring structure in a crossbar manner in a specific embodiment. A corresponding structure having side wall structure is illustrated in FIG. 10(a).

For amorphous silicon material as the switching material, the silver material forms a silver region in a portion of the amorphous silicon material when a positive bias voltage greater than a forming voltage is applied to the top wiring structure. The use of the silver material as the top wiring structure thus eliminate an additional step of metal deposition and simplify process. Additional advantage of using silver as the top wiring structure is low resistivity and a smaller thickness needed to form interconnects, among others. After forming, the device is in at a high resistance state or an off state, and an off state current $I_{off}$ flows in the device. The silver region further comprises a silver filament characterized by a length and a distance between silver particles. The length of the silver filament depends at least on an operating voltage of the resistive switching device. When a write voltage is applied, the filament extends and the device is in a low resistance state or an on state, and an on state current $I_{on}$ flows in the device. The filament retracts when an erase voltage having an opposite polarity to the write voltage is applied and the device is caused to revert back to the high resistance state. To perform a read operation, a read voltage is applied, a read current is measured, and the resistance state of the device can be determined.

Referring again to FIG. 9(a), the sidewall spacer structure effectively reduces an active device area for the non-volatile memory device. As off state current is essentially dominated by a leakage current through the amorphous silicon switching layer, a smaller device area would improve an $I_{on}/I_{off}$ ratio and improves a signal to noise ratio for selected device in a read operation. This enables a high density array of devices and reduces cost of fabrication. Of course one skilled in the art would recognize other variations, modifications, and alternatives.

The above sequence of steps provides a method to form a crossbar array of memory cells overlying a substrate according to embodiments of the present invention. Each of the top wiring structure and the bottom wiring structure can be further extend into respectively a first periphery region and a second periphery region to connect to their respective control circuitry configured on the substrate in a specific embodiment. Depending on the application, one or more steps may be added, one or more steps may be omitted, or one or more step may be provided in a different sequence. One skilled in the art would recognize other variations, modifications, and alternatives.

In a specific embodiment, a method for forming a multilayer memory device is provided. Depending on the application, the multilayer memory device can have one to eight of crossbar arrays of memory cells. The method includes providing a substrate having a surface region. The substrate can be a single crystal silicon, silicon germanium, or a silicon on insulator (commonly known as SOI) substrate. In a specific embodiment, the semiconductor substrate can further include one or more transistor devices formed thereon. The one or more transistor devices provide controlling circuitry for the memory device in a specific embodiment.

The method forms a first dielectric material overlying the semiconductor substrate. The first dielectric material can be silicon oxide, silicon nitride, multilayer stack of alternating dielectric materials such as an alternating layers of silicon oxide on silicon nitride on silicon oxide (commonly known as ONO), high K dielectric, low K dielectric, and others.

The method includes forming a first crossbar array of memory cells overlying the first dielectric material using substantially the same steps for forming a single layer of crossbar array of memory cells. The first crossbar array of memory cells includes a first bottom wiring structure configured to spatially extend in a first direction. The first bottom wiring structure includes a silver material in a specific embodiment. The method includes forming a first switching region overlying the first bottom wiring structure. The first switching region includes an amorphous silicon material in a specific embodiment. A first top wiring structure is formed overlying at least the amorphous silicon switching region. The first top wiring structure includes a silver material in a specific embodiment. The first top wiring structure is configured to spatially extend in a second direction orthogonal to the first direction in a specific embodiment. The first switching region is configured to formed in an intersecting region of sandwiched between the first top wiring structure and the first top wiring structure in a specific embodiment.

The method includes forming a second dielectric material overlying the first top wiring structure of the first crossbar array of memory cells. A second crossbar array of memory cells are formed overlying the second dielectric material using substantially the same steps as for the first crossbar array of memory cells. The second crossbar array of memory cells includes a second bottom wiring structure configured to spatially extend and parallel in the first direction. The first bottom wiring structure includes a silver material in a specific embodiment. The method includes forming a second switching region overlying the second bottom wiring structure. The second switching region includes an amorphous silicon material in a specific embodiment. A second top wiring structure is formed overlying at least the amorphous silicon switching region. The second top wiring structure includes a silver material in a specific embodiment. The second top wiring structure is configured to spatially extend and parallel to the second direction orthogonal to the first direction in a specific embodiment. The second switching region is configured to formed in an intersecting region of sandwiched between the second top wiring structure and the second top wiring structure in a specific embodiment. The method can continue to form a third dielectric material overlying the second crossbar array of memory cells and a third crossbar array of memory cells overlying the third dielectric material in a same manner as forming the second crossbar array of memory cells. Depending on the embodiment, N crossbar arrays of memory cells can be formed, where is an integer ranging from one to eight. Each of the Nth crossbar array of memory cells is isolated from an (N−1)th crossbar array of memory cells by an Nth dielectric material in a specific embodiment.

Figure 11:
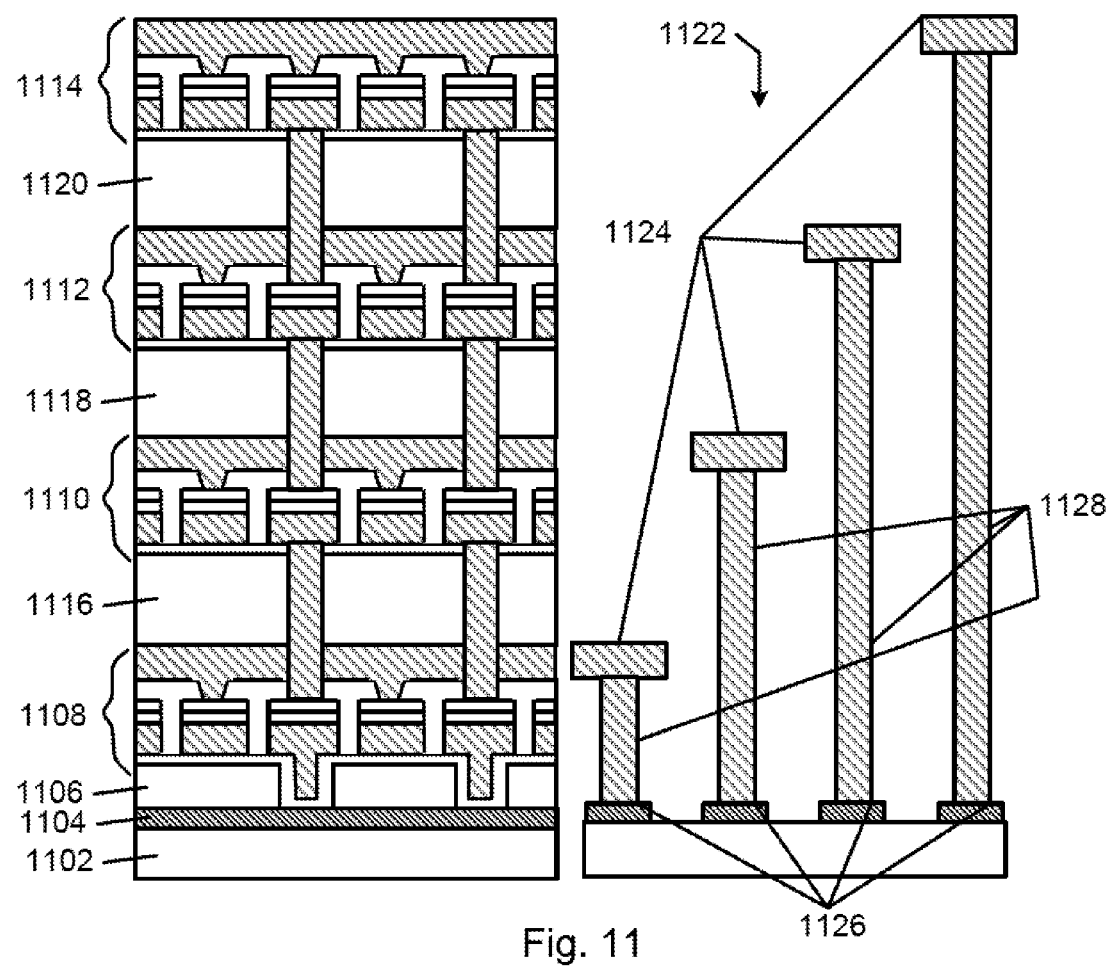
FIG. 11 is a simplified diagram illustrating a multilayer memory cell according to an embodiment of the present invention.

Referring to FIG. 11, a four crossbar arrays of memory cells vertically stacked is illustrated. As shown the four crossbar arrays of memory cells include a substrate 1102. The substrate can be a semiconductor substrate. In a specific embodiment, the substrate can have one or more controlling transistors formed thereon. An interconnect 1104 from the one or more controlling transistors is show. A first dielectric material 1106 overlies interconnect 1104. A first crossbar array of memory cells 1108 overlies the first dielectric material. A second crossbar array of memory cells 1110, a third crossbar array of memory cells 1112, and a fourth crossbar array of memory cells 1114 are illustrated. The second crossbar array of memory cells are isolated from the first crossbar array of memory cells by dielectric material 1116. The third crossbar array of memory cells are isolated from the second crossbar array of memory cells by dielectric material 1110. The fourth crossbar array of memory cells are isolated from the third crossbar array of memory cells by dielectric material 1120. Also illustrated in FIG. 11, each of the respective top wiring structures 1124 comprising a silver material extends to a peripheral region 1122 and connected to their respective control circuits 1126 on the substrate using their respective vertical interconnect 1128.

Embodiments according to the present invention provides a method and a structure for a multilayer crossbar arrays of memory cells vertically stacked using a silver material for interconnects. Silver material as interconnects reduces resistivity of the interconnects and simplifies process, enhances device performance and improves device yield.

Though the present invention has been described using various examples and embodiments, it is also understood that the examples and embodiments described herein are for illustrative purposes only and that various modifications or alternatives in light thereof will be suggested to persons skilled in the art and are to be included within the spirit and purview of this application and scope of the appended claims.

What is claimed is:

1. A method of forming a memory device, comprising:
   providing a substrate having a surface region;
   forming a first thickness of dielectric material overlying the surface region;
   subjecting the first thickness of dielectric material to a first patterning and etching process to form a first opening structure in a portion of the first thickness of dielectric material;
   depositing a first wiring material comprising at least a silver material to fill the opening structure and forming a thickness of the first wiring material overlying the first dielectric material;
   depositing a switching material comprising an amorphous silicon material overlying the first wiring material;
   subjecting at least the switching material and the thickness of the first wiring material to a first patterning and etching process to form one or more first structures, the first structures comprising a switching element and a first wiring structure comprising at least the first silver material, the first wiring structure being elongated in shape and spatially configured to extend in a first direction;
   depositing a second thickness of dielectric material overlying the one or more first structures;
   forming a via opening in the second thickness of dielectric material overlying at least a first portion of the switching element in each of the one or more first structure; and forming a second wiring structure overlying the switching element, the second wiring structure comprising at least a second silver material and having a first portion in the via and being in electrical contact with at least a second the portion of the switching element, and a second portion elongated in shape and spatially configured to extend in a second direction orthogonal to the first direction.

2. The method of claim 1 further comprising depositing a first lining material overlying the first opening structure, the first lining material is selected from a group consisting of: titanium, titanium nitride, tantalum nitride, or tungsten nitride, and a combination thereof.

3. The method of claim 1 further comprising depositing a first adhesion material overlying the first wiring material, the first adhesion material selected from a group consisting of: titanium, titanium nitride, tantalum nitride, or tungsten nitride, and a combination thereof.

4. The method of claim 2 wherein the first lining material further comprises a dielectric diffusion barrier material; and
    wherein the dielectric diffusion barrier material comprises a silicon carbide material.

5. The method of claim 2 wherein the first structure comprises a switching region, the switching region comprises the amorphous silicon material.

6. The method of claim 2 further comprising forming a dielectric spacer structure overlying within the via.

7. The method of claim 1 wherein the first silver material is deposited using a physical vapor deposition process or an electrochemical deposition method including electroplating and electroless deposition or a damascene process, and any combination of these.

8. The method of claim 1 wherein the semiconductor substrate is a material selected from a group consisting of: single crystal silicon wafer, silicon on insulator substrate, silicon germanium, or a combination.

9. The method of claim 1 wherein the first thickness of dielectric material is selected from a group consisting of: silicon oxide, silicon nitride, a high K dielectric, a low K dielectric, a multilayer dielectric stack, or a combination.

10. The method of claim 1 wherein the second silver material forms a silver region in a portion of the switching element upon application of a forming voltage greater than a threshold voltage.

11. The method of claim 1 further comprising forming a contact material interposed between the switching material and the first wiring material,
    wherein the contact material comprises a p+ polysilicon material, wherein the p+ polysilicon material is configured to reduce a defect density at an interface region between the p+ polysilicon material and the first wiring material.

12. A non-volatile memory device structure, comprising:
a semiconductor substrate comprising a surface region;
a first dielectric material overlying the surface region of the semiconductor substrate;
a bottom wiring structure comprising at least a first silver material overlying the first dielectric material, the bottom wiring structure being configured to spatially extend in a first direction;
a contact material comprising a p+ polysilicon material overlying the bottom wiring structure;
a switching material comprising an amorphous silicon material overlying the contact material; and
a top wiring structure comprising at least a second silver material overlying the switching material, the top wiring structure comprising a first portion of the second silver material disposed in a via structure in direct contact with the switching material and a second portion configured to spatially extend in a second direction orthogonal to the first direction.

13. The device of claim 12 wherein the semiconductor substrate is a material selected from a group consisting of: single crystal silicon, silicon germanium, or silicon on insulator (SOI).

14. The device of claim 12 wherein the switching material forms a switching region in an intersecting region of at least a portion of the top wiring structure and at least a portion of the bottom wiring structure.

15. The device of claim 12 wherein the second silver material forms a silver region in a portion of the amorphous silicon material upon application of a threshold voltage greater than a forming voltage.

16. The device of claim 12 wherein the via structure comprises a via opening comprising a dielectric sidewall structure.

17. A memory device; comprising
a semiconductor substrate having a surface region;
a first dielectric material overlying the semiconductor substrate;
a first crossbar array of memory cells, comprising a first bottom wiring structure comprising a first silver material spatially extending in a first direction, a first top wiring structure comprising a second silver material spatially extending in a second direction orthogonal to the first direction, and a first switching region comprising an amorphous silicon material disposed between the first wiring structure and the second wiring structure;
a second dielectric material overlying the first crossbar array of memory cells; and
a second crossbar array of memory cells overlying the second dielectric material, the second crossbar array of memory cells comprising a second bottom wiring structure comprising a third silver material spatially extending in the first direction; a second top wiring structure comprising a fourth silver material spatially extending in the second direction, and a second switching region disposed between the second bottom wiring structure and the second top wiring structure.

18. The device of claim 17 wherein the first top wiring structure comprises a first portion having a first portion and a second portion, the first portion is disposed in a via structure overlying the first switching region, the second portion is elongated in shape and spatially configured to extend in the second direction.

19. The device of claim 17 wherein the second top wiring structure comprises a first portion having a first portion and a second portion, the first portion is disposed in a via structure overlying the second switching region, the second portion is elongated in shape and spatially configured to extend in the second direction.

20. The device of claim 17 further comprising a third dielectric material overlying the second crossbar array of memory cells and a third crossbar array of memory cells overlying the third dielectric material.

21. The device of claim 17 further comprising an Nth dielectric material overlying the (N−1)th crossbar array of memory cells and an Nth crossbar array of memory cells overlying the Nth dielectric material, where N is an integer ranging from 1 to 8.

* * * * *